United States Patent
Frank et al.

(10) Patent No.: US 10,228,464 B2
(45) Date of Patent: *Mar. 12, 2019

(54) IMPLEMENTING ENHANCED CMOS INVERTER BASED OPTICAL TRANSIMPEDANCE AMPLIFIER

(71) Applicant: International Business Machines Corporation, Armonk, NY (US)

(72) Inventors: Matthew B. Frank, Rochester, MN (US); Raymond A. Richetta, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/828,200

(22) Filed: Nov. 30, 2017

(65) Prior Publication Data
US 2018/0088237 A1    Mar. 29, 2018

Related U.S. Application Data

(63) Continuation of application No. 15/405,114, filed on Jan. 12, 2017, now Pat. No. 9,893,681, and a
(Continued)

(51) Int. Cl.
*H03F 3/08* (2006.01)
*G01S 17/10* (2006.01)
(Continued)

(52) U.S. Cl.
CPC ........ *G01S 17/102* (2013.01); *G06F 17/5077* (2013.01); *G06F 17/5081* (2013.01);
(Continued)

(58) Field of Classification Search
CPC . H03F 3/08; H03F 3/085; H03F 17/00; H03F 3/087; H03F 1/26; H03F 3/45179;
(Continued)

(56) References Cited

U.S. PATENT DOCUMENTS

| 4,574,249 A | 3/1986 | Williams |
| 5,343,160 A * | 8/1994 | Taylor ..................... H03F 3/087 330/295 |

(Continued)

OTHER PUBLICATIONS

Appendix P List of Patents and Patent Applications Treated as Related Jan. 30, 2018.

*Primary Examiner* — Khanh V Nguyen
(74) *Attorney, Agent, or Firm* — Joan Pennington

(57) ABSTRACT

A method and circuit are provided for implementing enhanced CMOS inverter based optical Transimpedance Amplifiers (TIAs). A transimpedence amplifier (TIA) includes a photo-detector, and the TIA is formed by a first TIA inverter and a second TIA inverter. The first TIA inverter has an input from a cathode side of the photo-detector and the second inverter has an input from an anode side of the photo-detector. A replica TIA is formed by two replica inverters, coupled to a respective input to a first operational amplifier and a second operational amplifier. The first operational amplifier and the second operational amplifier have a feedback configuration for respectively regulating a set voltage level at the cathode side of the photo-detector input of the first inverter and at the anode side of the photo-detector input of the second inverter.

7 Claims, 2 Drawing Sheets

Related U.S. Application Data continuation of application No. 14/611,789, filed on Feb. 2, 2015, now Pat. No. 9,571,045.

(51) Int. Cl.
| | |
|---|---|
| *G06F 17/50* | (2006.01) |
| *H03G 1/00* | (2006.01) |
| *H03F 1/26* | (2006.01) |
| *H03F 1/42* | (2006.01) |
| *H03F 3/45* | (2006.01) |
| *H03G 3/30* | (2006.01) |

(52) U.S. Cl.
CPC ............... *H03F 1/26* (2013.01); *H03F 1/42* (2013.01); *H03F 3/082* (2013.01); *H03F 3/087* (2013.01); *H03F 3/45179* (2013.01); *H03F 3/45475* (2013.01); *H03G 1/0047* (2013.01); *H03F 3/08* (2013.01); *H03F 3/085* (2013.01); *H03F 2200/165* (2013.01); *H03F 2203/45116* (2013.01); *H03G 3/3084* (2013.01)

(58) Field of Classification Search
CPC ...... H03F 1/42; H03G 1/0047; H03G 3/3084; G06F 17/5077; G06F 17/5081
USPC .................. 330/59, 308; 250/214 A, 214 AG
See application file for complete search history.

(56) References Cited

U.S. PATENT DOCUMENTS

| | | | |
|---|---|---|---|
| 5,773,815 A * | 6/1998 | Stevens | .................. H03F 3/082 250/214 A |
| 5,886,581 A | 3/1999 | Hugel et al. | |
| 6,323,734 B1 * | 11/2001 | Henrion | .................. H03F 3/087 250/214 A |
| 6,359,517 B1 | 3/2002 | Colaco | |
| 6,496,525 B1 | 12/2002 | Kimura | |
| 6,664,858 B2 | 12/2003 | Feng | |
| 6,707,023 B2 * | 3/2004 | Fong | ...................... H03F 3/087 250/214 A |
| 7,319,365 B2 | 1/2008 | Fujita | |
| 7,734,193 B2 | 6/2010 | Day | |
| 7,939,790 B1 | 5/2011 | Lee et al. | |
| 8,139,957 B2 | 3/2012 | Bowler et al. | |
| 8,471,639 B2 | 6/2013 | Welchg | |
| 8,509,629 B2 | 8/2013 | Zou et al. | |
| 8,593,226 B2 | 11/2013 | Proesel et al. | |
| 9,276,535 B2 | 3/2016 | van Sinderen et al. | |
| 2002/0105385 A1 | 8/2002 | Beuscher et al. | |
| 2010/0060562 A1 | 3/2010 | Hadwen et al. | |
| 2013/0016965 A1 | 1/2013 | Christensen | |
| 2014/0340151 A1 | 11/2014 | van Sinderen et al. | |

\* cited by examiner

IMPLEMENTING ENHANCED CMOS INVERTER BASED OPTICAL TRANSIMPEDANCE AMPLIFIER

This application is a continuation application of Ser. No. 15/405,114 filed Jan. 12, 2017, now U.S. Pat. No. 9,893,681 issued Feb. 13, 2018, which is a continuation application of Ser. No. 14/611,789 filed Feb. 2, 2015, now U.S. Pat. No. 9,571,045 issued Feb. 14, 2017.

FIELD OF THE INVENTION

The present invention relates generally to the data processing field, and more particularly, relates to a method and circuit for implementing enhanced CMOS inverter based optical Transimpedance Amplifiers (TIAs), and a design structure on which the subject circuit resides.

DESCRIPTION OF THE RELATED ART

The design of an effective high speed (25 GBPS or greater) Optical Receiver path with complementary metal oxide semiconductor (CMOS) inverter based Transimpedance Amplifiers (TIAs) is challenging. Bandwidth limitations in the signal path manifest themselves as runt pulses. Runt pulses can be observed when the input a pseudo-random binary sequence (PR BS) data stream results in single unit interval (1 UI) pulses which are much smaller in amplitude than pulses greater than 1 UI. Any technique that increases the amplitude of theses runt pulses results in improved high speed performance.

A need exists for a method and circuit for implementing enhanced CMOS inverter based optical Transimpedance Amplifiers (TIAs).

SUMMARY OF THE INVENTION

Principal aspects of the present invention are to provide a method and circuit for implementing enhanced CMOS inverter based optical Transimpedance Amplifiers (TIAs), and a design structure on which the subject circuit resides. Other important aspects of the present invention are to provide such method, circuit and design structure substantially without negative effects and that overcome many of the disadvantages of prior art arrangements.

In brief, a method and circuit are provided for implementing enhanced CMOS inverter based optical Transimpedance Amplifiers (TIAs). A transimpedence amplifier (TIA) includes a photo-detector, the TIA is formed by a first TIA inverter and a second TIA inverter. The first TIA inverter has an input from a cathode side of the photo-detector and the second inverter has an input from an anode side of the photo-detector. A replica TIA is formed by two replica inverters, coupled to a respective input to a first operational amplifier and a second operational amplifier. The first operational amplifier and the second operational amplifier have a feedback configuration for respectively regulating a set voltage level at the cathode side of the photo-detector input of the first inverter and at the anode side of the photo-detector input of the second inverter.

In accordance with features of the invention, the first feedback operational amplifier provides a gate input to a feedback PFET connected between a voltage supply rail VDD and the cathode side of the photo-detector input of the first inverter. The second feedback operational amplifier provides a gate input to a feedback NFET connected between a ground rail and the anode side of the photo-detector input of the second inverter.

In accordance with features of the invention, by using pseudo-differential connection of the photo-detector early in the signal path effectively doubles the amplitude of runt pulses.

In accordance with features of the invention, as compared with single ended photo-detector based prior art TIA, the topology of the transimpedence amplifier (TIA) with the differential connection of the photo-detector results in enhanced input signal sensitivity, increased bandwidth and enhanced noise performance.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit are provided for implementing enhanced CMOS inverter based optical Transimpedance Amplifiers (TIAs), and a design structure on which the subject circuit resides.

Figure 1:
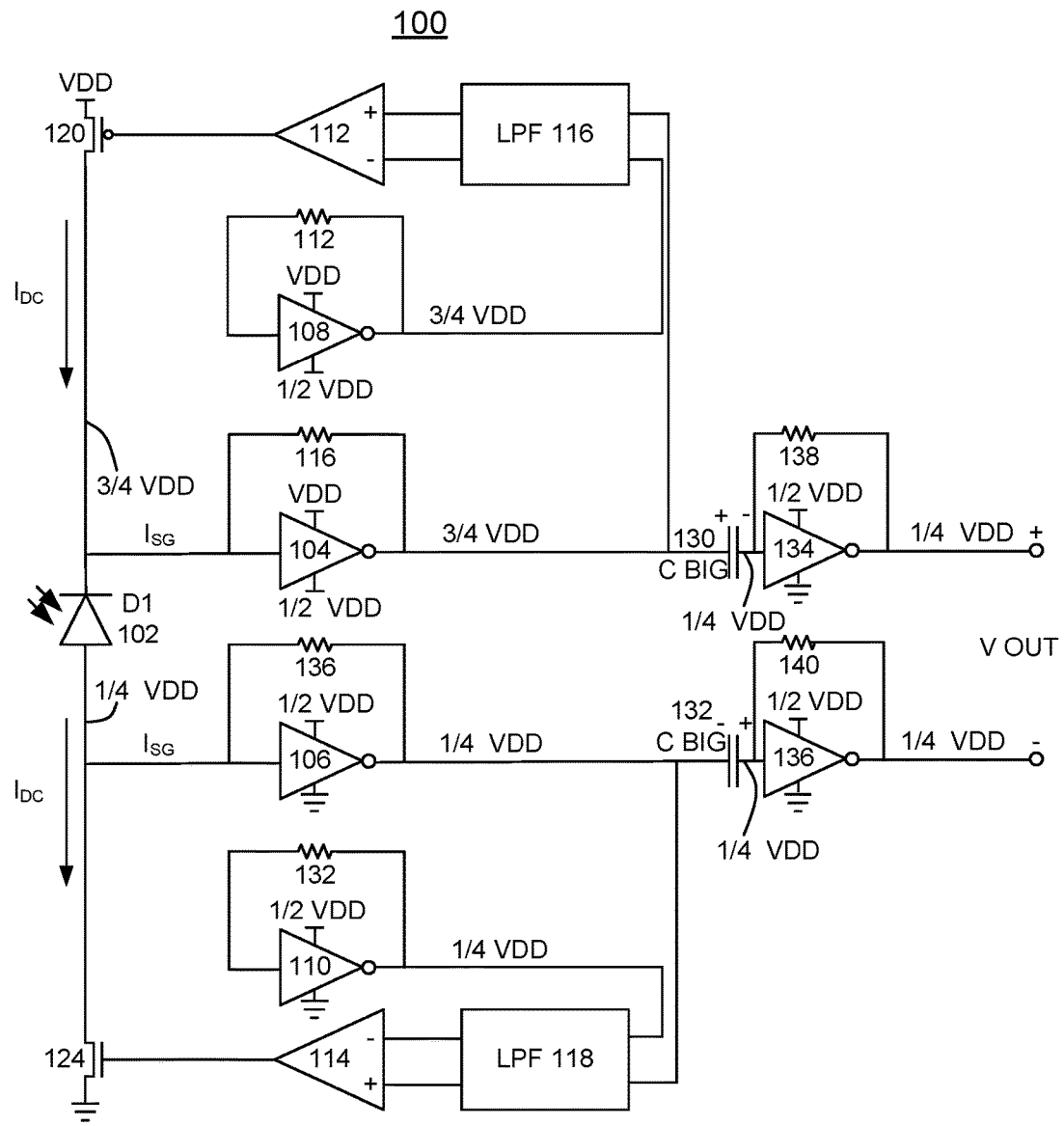
FIG. 1 is a schematic and block diagram of an example enhanced CMOS inverter based optical Transimpedance Amplifier (TIA) in accordance with preferred embodiments.

Having reference now to the drawings, in FIG. 1, there is shown an example circuit generally designated by the reference character 100 for implementing enhanced CMOS inverter based optical Transimpedance Amplifiers (TIAs) in accordance with preferred embodiments.

Circuit 100 includes a CMOS inverter based optical transimpedence amplifier (TIA) including a transimpedence amplifier (TIA) that includes a photo-detector D1, 102, with the TIA is formed by a first TIA inverter 104 and a second TIA inverter 106. The first TIA inverter 104 has an input from a cathode side of the photo-detector 102 and the second TIA inverter 106 has an input from an anode side of the photo-detector 102. A replica TIA is formed by two replica inverters 108, 110, coupled to a respective input to a first operational amplifier 112 and a second operational amplifier 114 via a respective one of low pass filters (LPFs) 116, 118. The first operational amplifier 112 and the second operational amplifier 114 have a feedback configuration for respectively regulating a set voltage level at the cathode side of the photo-detector 102 input of the first inverter 104 and at the anode side of the photo-detector 102 input of the second inverter 106.

The first feedback operational amplifier 112 provides a gate input to a feedback PFET 120 connected between a voltage supply rail VDD and the cathode side of the photo-detector 102 input of the first inverter 104. The second feedback operational amplifier 114 provides a gate input to a feedback NFET 124 connected between a ground rail and the anode side of the photo-detector 102 input of the second inverter 106.

As shown, the cathode and anode of the photo-detector is respectively biased at ¾ of VDD and ¼ of VDD. It should be understood that the present invention is not limited to the illustrated bias voltages, other bias voltages than ¾ VDD and ¼ VDD could be chosen. It should be noted that the high common mode TIA inverter 104 and replica TIA inverter 108 operate between VDD and ½ VDD where low common mode TIA inverter 106 and replica TIA inverter 110 operate between ½ VDD and ground. In the illustrated embodiment, VDD is 2.4 volts so the high common mode TIA inverter 104 and replica TIA inverter 108 operate between 2.4 and 1.2 volts, where the low common mode TIA inverter 106 and replica TIA inverter 110 operate between 1.2 volts and ground. Two capacitors 130, 132 labeled as C BIG are provided to couple the resulting signal into a respective optional inverter 134, 136, including a respective feedback resistor 138, 140, which drive a limiting amplifier (not shown). The inverters 134, 136 operate between ½ VDD and ground.

In accordance with features of the invention, two independent control loops control the photo-detector bias currents I DC. These loops require differential Low Pass Filters (LPFs) 116, 118 and operational amplifiers 112, 114 to drive PFET output device 120 and NFET output device 124. The LPFs 116, 118 are simple RC filters. Replica TIAs 108, 110 provide reference voltages for the LPFs 116, 118 and are also used in the regulator control loops, as shown.

In accordance with features of the invention, by using pseudo-differential techniques early in the signal path the amplitude of runt pulses effectively doubles, which includes the pseudo-differential connection of the photo-detector 102 with pull-up PFET 120 and pull-down NFET 124. As compared with single ended photo-detector based prior art TIA, the topology of the transimpedance amplifier (TIA) circuit 100 with the differential connection of the photo-detector 102 results in better input signal sensitivity, increased bandwidth and better noise performance.

It should be noted that by using circuit 100 with this new configuration for typical process corners a 9 dB better incident signal performance is observed together with 36% improved datarate performance.

Figure 2:
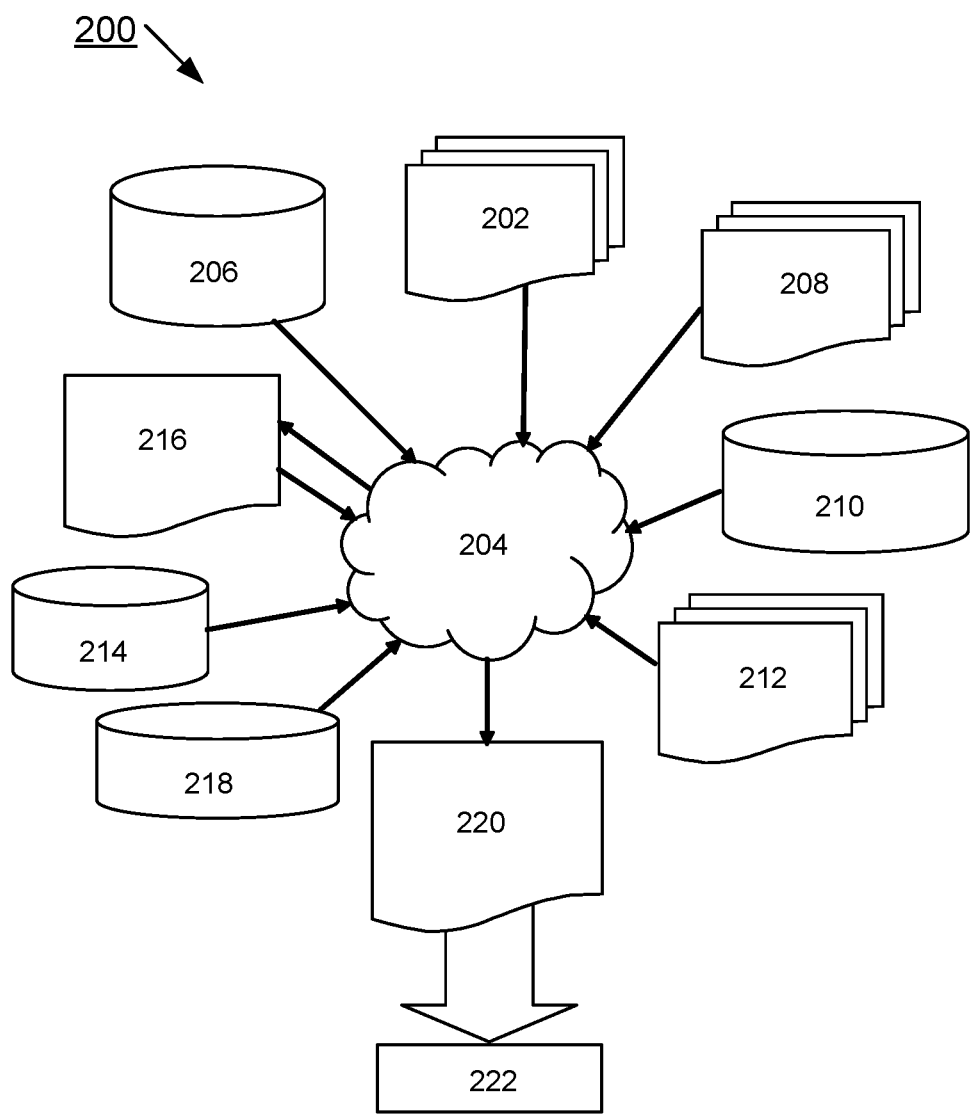
FIG. 2 is a flow diagram of a design process used in semiconductor design, manufacturing, and/or test.

FIG. 2 shows a block diagram of an example design flow 200. Design flow 200 may vary depending on the type of IC being designed. For example, a design flow 200 for building an application specific IC (ASIC) may differ from a design flow 200 for designing a standard component. Design structure 202 is preferably an input to a design process 204 and may come from an IP provider, a core developer, or other design company or may be generated by the operator of the design flow, or from other sources. Design structure 202 comprises circuit 100 in the form of schematics or HDL, a hardware-description language, for example, Verilog, VHDL, C, and the like. Design structure 202 may be contained on one or more machine readable medium. For example, design structure 202 may be a text file or a graphical representation of circuit 100. Design process 204 preferably synthesizes, or translates, circuit 100 into a netlist 206, where netlist 206 is, for example, a list of wires, transistors, logic gates, control circuits, I/O, models, etc. that describes the connections to other elements and circuits in an integrated circuit design and recorded on at least one of machine readable medium. This may be an iterative process in which netlist 206 is resynthesized one or more times depending on design specifications and parameters for the circuit.

Design process 204 may include using a variety of inputs; for example, inputs from library elements 208 which may house a set of commonly used elements, circuits, and devices, including models, layouts, and symbolic representations, for a given manufacturing technology, such as different technology nodes, 14 nm, 22 nm, 32 nm, 45 nm, 90 nm, and the like, design specifications 210, characterization data 212, verification data 214, design rules 212, and test data files 218, which may include test patterns and other testing information. Design process 204 may further include, for example, standard circuit design processes such as timing analysis, verification, design rule checking, place and route operations, and the like. One of ordinary skill in the art of integrated circuit design can appreciate the extent of possible electronic design automation tools and applications used in design process 204 without deviating from the scope and spirit of the invention. The design structure of the invention is not limited to any specific design flow.

Design process 204 preferably translates an embodiment of the invention as shown in FIG. 1 along with any additional integrated circuit design or data (if applicable), into a second design structure 220. Design structure 220 resides on a storage medium in a data format used for the exchange of layout data of integrated circuits, for example, information stored in a GDSII (GDS2), GL1, OASIS, or any other suitable format for storing such design structures. Design structure 220 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 1. Design structure 220 may then proceed to a stage 222 where, for example, design structure 220 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing an enhanced bias configuration for CMOS inverter based optical Transimpedance Amplifiers (TIAs) comprising:

a Transimpedance Amplifier (TIA) including a photo-detector, and the TIA being formed by a first TIA inverter and a second TIA inverter;

said first TIA inverter having an input from a cathode side of said photo-detector and said second TIA inverter with an input from an anode side of said photo-detector;

a respective output of said first TIA inverter and said second TIA inverter coupled to a respective input of a first operational amplifier and a second operational amplifier;

said first operational amplifier and said second operational amplifier in a feedback configuration for respectively biasing a set voltage level at said cathode side photo-detector input to said first TIA inverter and at said anode side photo-detector input of said second TIA inverter; and a respective AC coupling capacitor for respectively AC coupling output signals from said first TIA inverter and said second TIA inverter to a first output inverter and a second output inverter.

2. The circuit as recited in claim 1 includes a P-channel field effect transistor (PFET) connected between a voltage rail VDD and the cathode side of the photo-detector input of said first TIA inverter.

3. The circuit as recited in claim 2 includes an N-channel field effect transistor (NFET) connected between a ground rail and the anode side of the photo-detector input of said second TIA inverter.

4. The circuit as recited in claim 2 wherein said P-channel field effect transistor (PFET) receiving a gate input from an output of said first operational amplifier.

5. The circuit as recited in claim 3 wherein said NFET receiving a gate input from an output of said second operational amplifier.

6. The circuit for implementing an enhanced bias configuration for CMOS inverter based optical Transimpedance Amplifiers (TIAs) comprising:

a Transimpedance Amplifier (TIA) including a photo-detector, and the TIA being formed by a first TIA inverter and a second TIA inverter;

said first TIA inverter having an input from a cathode side of said photo-detector and said second TIA inverter with an input from an anode side of said photo-detector;

a respective output of said first TIA inverter and said second TIA inverter coupled to a respective input of a first operational amplifier and a second operational amplifier; and said first operational amplifier and said second operational amplifier in a feedback configuration for respectively biasing a set voltage level at said cathode side photo-detector input to said first TIA inverter and at said anode side photo-detector input of said second TIA inverter;

a replica TIA formed by two replica inverters, a respective output of said respective replica inverters coupled to another respective input of said first operational amplifier and said second operational amplifier.

7. The circuit for implementing an enhanced bias configuration for CMOS inverter based optical Transimpedance Amplifiers (TIAs) comprising:

a Transimpedance Amplifier (TIA) including a photo-detector, and the TIA being formed by a first TIA inverter and a second TIA inverter;

said first TIA inverter having an input from a cathode side of said photo-detector and said second TIA inverter with an input from an anode side of said photo-detector;

a respective output of said first TIA inverter and said second TIA inverter coupled to a respective input of a first operational amplifier and a second operational amplifier; and said first operational amplifier and said second operational amplifier in a feedback configuration for respectively biasing a set voltage level at said cathode side photo-detector input to said first TIA inverter and at said anode side photo-detector input of said second TIA inverter a replica TIA formed by two replica inverters, a respective low pass filter (LPF) coupled between said respective inputs of said first operational amplifier and said second operational amplifier and said respective outputs of said two replica inverters and said respective output of said first TIA inverter and said second TIA inverter.

\* \* \* \* \*